United States Patent [19]
Woolaway et al.

[11] Patent Number: 6,133,596
[45] Date of Patent: Oct. 17, 2000

[54] NEAR COMPLETE CHARGE TRANSFER DEVICE

[75] Inventors: James T. Woolaway; William J. Parrish, both of Goleta; Stephen H. Black, Buellton, all of Calif.

[73] Assignees: Raytheon Company, Lexington, Mass.; Indigo Systems Corporation, Goleta, Calif.

[21] Appl. No.: 09/296,047

[22] Filed: Apr. 21, 1999

[51] Int. Cl.[7] .................... H01L 27/148; H01L 29/768
[52] U.S. Cl. .................. 257/251; 257/236; 257/239; 257/241; 348/295; 348/300; 348/322; 348/324
[58] Field of Search .................... 257/215, 235, 257/236, 237, 239, 241, 251; 348/295, 300, 322, 324

[56] References Cited

U.S. PATENT DOCUMENTS

| | | |
|---|---|---|
| 4,559,638 | 12/1985 | Bluzer et al. . |
| 4,709,380 | 11/1987 | Itoh . |
| 5,146,302 | 9/1992 | Kumada . |
| 5,453,781 | 9/1995 | Stein ........................................ 348/169 |

*Primary Examiner*—Ngân V. Ngô
*Attorney, Agent, or Firm*—William C. Schubert; Glenn H. Lenzen, Jr.

[57] ABSTRACT

A charge transfer structure (30) includes a substrate comprised of semiconductor material and, coupled to a surface of the substrate, a plurality of serially coupled devices each having a gate terminal. The plurality of serially coupled devices include a first single port device (D1) defining a first primary charge storage well, a second single port device (D3) defining a second primary charge storage well, a first two port device (D2) defining a first transfer device, a second two port device (D4) defining a second transfer device, and two instances of a third two port device each defining a cascode device (CD). The ports of these devices are serially coupled together in an order given by D1, D2, CD, D3, D4, CD for transferring charge between the first and second primary charge storage wells. Charge is inserted into and withdrawn from each of the first and second primary charge storage wells through a single diffusion that functions as both an input port and an output port. A clock signal (P1) applied to the gate of D1 and a clock signal (P3) applied to the gate of D3 are each predetermined to deplete an underlying surface region of the substrate for forming the first primary charge storage well and the second primary charge storage well, respectively, without requiring the use of diffusion implants as in conventional bucket brigade devices.

21 Claims, 7 Drawing Sheets

NEAR COMPLETE CHARGE TRANSFER DEVICE

FIELD OF THE INVENTION

This invention relates generally to charge transfer devices and structures and, in particular, to circuitry and methods for reading out charge from a detector of optical radiation, and for generally transporting charge packets across a surface of a semiconductor device.

BACKGROUND OF THE INVENTION

Two charge transfer structures have traditionally been employed to realize a Time Delay and Integration (TDI) signal processing function on a readout integrated circuit (ROIC). These charge transfer structures are the charge coupled device (CCD) and the bucket brigade.

In order to obtain a high charge transfer efficiency (CTE) and a low noise performance, implementations for these charge transfer structures have required nonstandard fabrication processes. Specifically, the high CTE CCD structure typically requires the presence of active poly 1 and poly 2 metal oxide semiconductor (MOS) storage and transfer gates, and is thus not practical for realization in a single poly implementation. The bucket brigade structure typically utilizes a depletion implant to form a charge well and a charge transfer drain.

Unfortunately, process options for forming depletion implants, as well as multiple layers of active polygate structures, are becoming less common, and are generally not available in advanced sub-micron commercial CMOS technologies.

In general, both of the CCD and bucket brigade structures operate under the principal that a series of charge wells are created within the structure. Charge can be introduced into one or more of these wells. This charge can then be transferred through the structure from one charge well to another. This process provides the ability to move a quantity of charge, often referred to as a charge packet, from one location in an integrated circuit to another location. These structures therefore provide an ability to multiplex a large number of charge wells into a single output stage. In addition, multiple charge wells can be combined into a single well. Of particular interest to the teachings of this invention, this process can be employed to perform time delay and integration (TDI) signal processing function for infrared and other types of sensor arrays.

Reference in regard to the foregoing can be had, by example, to a publication entitled "Charge Coupled Devices and Systems", M. V. Howes and D. V. Morgan, John Wiley & Sons, 1979. Reference may also be had to U.S. Pat. No. 5,453,781, issued on Sep. 26, 1995 to John T. Stein, and entitled "Apparatus and Method for Minimizing Velocity-Mismatch MTF Degradation in TDI Systems" for a description of one type of TDI system which can be constructed using CCD technology. In general, a TDI system operates to synchronize the operation of the imaging system with a motion of a feature of interest in a scene viewed by the imaging system. By thereby increasing the charge integration time, a beneficial increase in both the sensitivity and the signal-to-noise ratio of the imaging system is achieved.

FIG. 1 and FIGS. 2A–2D (collectively referred to as FIG. 2) show timing and schematic diagrams, respectively, for a conventional four phase CCD structure, and are useful in explaining the operation of a four phase double poly CCD. Four wave forms are shown in FIG. 1, each corresponding to one of clock signal phases P1 through P4. For the purposes of explanation a P-channel 4-phase 2-poly CCD device is described. However, it is well known that the complementary configuration using N-channel devices can also be realized. Clocks P1 through P4 are shown such that the upper rail of the clock voltage represents zero volts, and the lower rail represents a negative voltage which is assumed to be sufficient for depleting the metal oxide semiconductor (MOS) surface that underlies the gate to which the clock is applied.

For the purposes of this discussion the process of biasing the MOS gate to form the depletion region or charge well is referred to as turning the gate "on", and the process of biasing the MOS gate to collapse the depletion region is referred to as turning the gate "off". At time location "A" shown in FIG. 1, the P1 and P4 gates are on or depleted and the P2 and P3 gates are off. It can be seen from FIG. 1 that the depleted clock phase shifts in time from the P1, P2, P3 through the P4 clocks.

Generally, in such a 4-phase CCD structure two of the 4-phases are designed as the primary charge storage or transfer wells. FIG. 2 shows that the P1 and P3 gates represent the primary charge transfer gates. The remaining two-phase gates are provided to aid the charge transfer process and direction control, and the P2 and P4 gates represent these transfer gates. The CCD gates P1 and P3 would generally be implemented using a poly-1 layer, and the gates P2 and P4 would be implemented using a poly-2 layer (i.e., a two poly-process). For the purposes of discussing the functionality of the CCD structure it is assumed that the initial charge injection occurs into the P1 primary charge transfer well. However, it should be recognized that the P3 gate can also serve this function.

The first step in the operation of the CCD circuit is the formation of a charge well under the P1 gate. This is accomplished by biasing the poly-1 P1 gate such that the MOS gate is depleted or on. This forms the charge well which, to a first order, is capable of holding a charge equal to the depleted surface potential delta multiplied by the well to gate capacitance. Charge is introduced into the first phase charge well by one of a number of means, and is generally performed by a charge injection circuit stage (not shown). FIG. 1 illustrates the timing relationship between clock phases P1, P2, P3 and P4 at time condition "A" when charge can be transferred into the P1 charge storage well. Charge is then transferred from the P1 primary storage well to the P3 primary store well. The timing for this process is shown in FIG. 1.

The schematic and surface potential diagrams for the charge transfer process is illustrated in FIG. 2. Specifically, FIGS. 2A–2D correspond to the four time points A–D shown in FIG. 1. At time point A (FIG. 2A) the gates P4 and P1 are biased on. At time point B (FIG. 2B) the gates P1 and P2 are biased on, while at time point C (FIG. 2C) the gates P2 and P3 are biased on, and at time point D (FIG. 2D) the gates P3 and P4 are biased on. Charge is transferred from the P1 storage well to the P3 storage well during a time that the P4 transfer gate is inhibiting transfer and is off, and the P2 and P3 gates are biased on. At the time the P1 gate transitions off, the P3 gate transitions on thereby extending the depleted MOS region from the P1 gate and through the P3 gate. Charge previously introduced into the P1 well is partitioned between the P1, P2 and P3 gates at this time. While the P2 and P3 gates are biased, the P1 gate clocks off, and charge under the P1 gate flows to the P2 and P3 depletion regions. The P2 gate is then clocked off, moving all of the charge to the P3 charge storage well. This process results in moving the charge from the P1 charge well to the P3 charge well. In a similar manner charge can be moved from the P3 charge well to the next P1 charge well.

The CCD structure offers a number of advantages. For example, the CCD structure makes very efficient utilization of available silicon integrated circuit real-estate for charge storage capacity. Since the CCD is normally operated as a complete charge transfer device, very high charge transfer efficiencies and low noise levels are achieved. However, the requirements for the manufacturing process to support an active poly-2 transistor, with the ability to form active devices crossing the overlapping boundary for the poly-1 and poly-2 structures, requires specialized processing that is not generally available in modern sub-micron commercial CMOS technology.

FIG. 3 and FIGS. 4A and 4B (collectively referred to as FIG. 4) illustrate the timing and schematic diagrams, respectively, for a conventional 2-phase bucket brigade structure. FIG. 4 illustrates a single poly implementation for the bucket brigade structure, which is assumed to be P-channel. FIG. 4A illustrates the two phase bucket brigade at timing condition "A" as illustrated in FIG. 3, while FIG. 4B illustrates the two phase bucket brigade at timing condition "B" as illustrated in FIG. 3. Sources for each transfer well are shown to the left side of each phase, P1 and P2, with a depletion implant (DI) covering most of the active area of each phase and forming the drain. For this type of device the charge is stored in the potential of the depletion implant.

Referring to FIG. 4A, at this time the bucket brigade gate P1 is clocked on, thereby lowering the potential of the MOS surface at the source of the charge well. This process also lowers the potential of the depletion implant and drain for the well. The potential of the gate P2 is raised at this time causing charge stored under P2 in the depletion implant to spill over the potential barrier established by the surface potential under the P1 gate and into the potential of the depletion implant under P1. This acts to raise the potential of the depletion implant located under P1 above the potential previously established by the P2 gate transfer barrier. The additional potential in the P1 depletion implant will then source the transfer charge to the P2 well in the subsequent transfer, as illustrated by timing condition "B" shown in FIG. 4B.

While relatively simple, the conventional bucket brigade structure suffers from a number of performance limitations. One primary limitation is that the principal charge storage well in the structure, the depletion implant, contributes kTC noise. As a consequence there is a direct relationship between the well capacity and the noise performance that can be achieved in the device. Furthermore, since the charge transfer process relies on a diffusion for supplying charge over a MOS barrier, the charge transfer process is incomplete, which presents limitations on the device charge transfer efficiency performance. In addition, the conventional bucket brigade fabrication process, while requiring only a single poly-process, also requires a depletion implant option. However, a depletion implant option for submicron CMOS processes is not readily available at many foundries.

OBJECTS AND ADVANTAGES OF THE INVENTION

It is a first object and advantage of this invention to provide a four phase near complete charge transfer device (NCCD) that overcomes many of the fundamental limitations of the bucket brigade structure, and that provides some of the advantages of the charge transfer device (CCD), such as noise levels and charge transfer efficiency that approaches the performance of the traditional CCD.

It is a another object and advantage of this invention to provide a NCCD that allows time delay and integration (TDI) signal processing functions to be performed.

It is a further object and advantage of this invention to provide a NCCD that enables time delay and integration (TDI) signal processing functions to be implemented in standard complementary metal oxide semiconductor (CMOS) processing technology.

SUMMARY OF THE INVENTION

The foregoing and other problems are overcome and the objects and advantages are realized by methods and apparatus in accordance with embodiments of this invention.

A charge transfer structure in accordance with this invention includes a substrate comprised of semiconductor material and, coupled to a surface of the substrate, a plurality of serially coupled devices each having a gate terminal. The plurality of serially coupled devices include a first single port device (D1) defining a first primary charge storage well, a second single port device (D3) defining a second primary charge storage well, a first two port device (D2) defining a first transfer device, a second two port device (D4) defining a second transfer device, and two instances of a third two port device each defining a cascode device (CD). The ports of these devices are serially coupled together in an order given by D1, D2, CD, D3, D4, CD for transferring charge between the first and second primary charge storage wells. In accordance with an aspect of this invention charge is inserted into and withdrawn from each of the first (D1) and second (D3) primary charge storage wells through a single diffusion that functions as both an input port and an output port.

A clock signal (P1) applied to the gate of D1 and a clock signal (P3) applied to the gate of D3 are each predetermined to deplete an underlying surface region of the substrate for forming the first primary charge storage well and the second primary charge storage well, respectively, without requiring the use of diffusion implants as in conventional bucket brigade devices.

For a P-channel embodiment the gates of D2 and D4 are each biased, when in an on state, such that a surface potential under the gates is more positive than a surface potential under the adjacent one of the CD gates, so as to minimize charge trapping under the D2 and D4 gates during charge transfer. In a related manner, the CD gates are biased so as to be more negative by a predetermined amount than the on-state magnitude of a bias potential applied to the gates of D2 and D4, and the magnitude of the bias potential applied to the CD gates, follows, preferably in an automatic fashion, the magnitude of the bias potential applied to the gates of D2 and D4. For an N-channel embodiment the polarities of the potentials are reversed such that the gates of D2 and D4 are each biased, when in the on state, such that the surface potential under the gates is more negative than the surface potential under the adjacent one of the CD gates, and the CD gates are biased so as to be more positive than the magnitude of the bias potential applied to the gates of D2 and D4.

When incorporated into, for example, a readout integrated circuit for use with a radiation detector array, the resulting charge transfer registers, referred to herein as "near complete charge transfer" devices, structures, or registers, enable time delay and integration (TDI) imaging systems to be constructed, to be constructed using standard CMOS processing technology, and to be constructed such that resulting registers exhibit low noise and a high CTE.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Described herein is a four phase near complete charge transfer device (NCCD) that overcomes many of the fundamental limitations of the bucket brigade structure, and that provides certain of the advantages of the conventional charge transfer device (CCD). As will be made apparent, some elements of the NCCD are similar to the bucket brigade structure, while others are similar to the conventional CCD. However, the configuration of the NCCD structure is novel and, as will be made apparent below, differs significantly from the conventional CCD and bucket brigade structures. Also, the NCCD structure can be fabricated in virtually any modern CMOS processing technology, including those using submicron CMOS processing methodologies.

Figure 5:
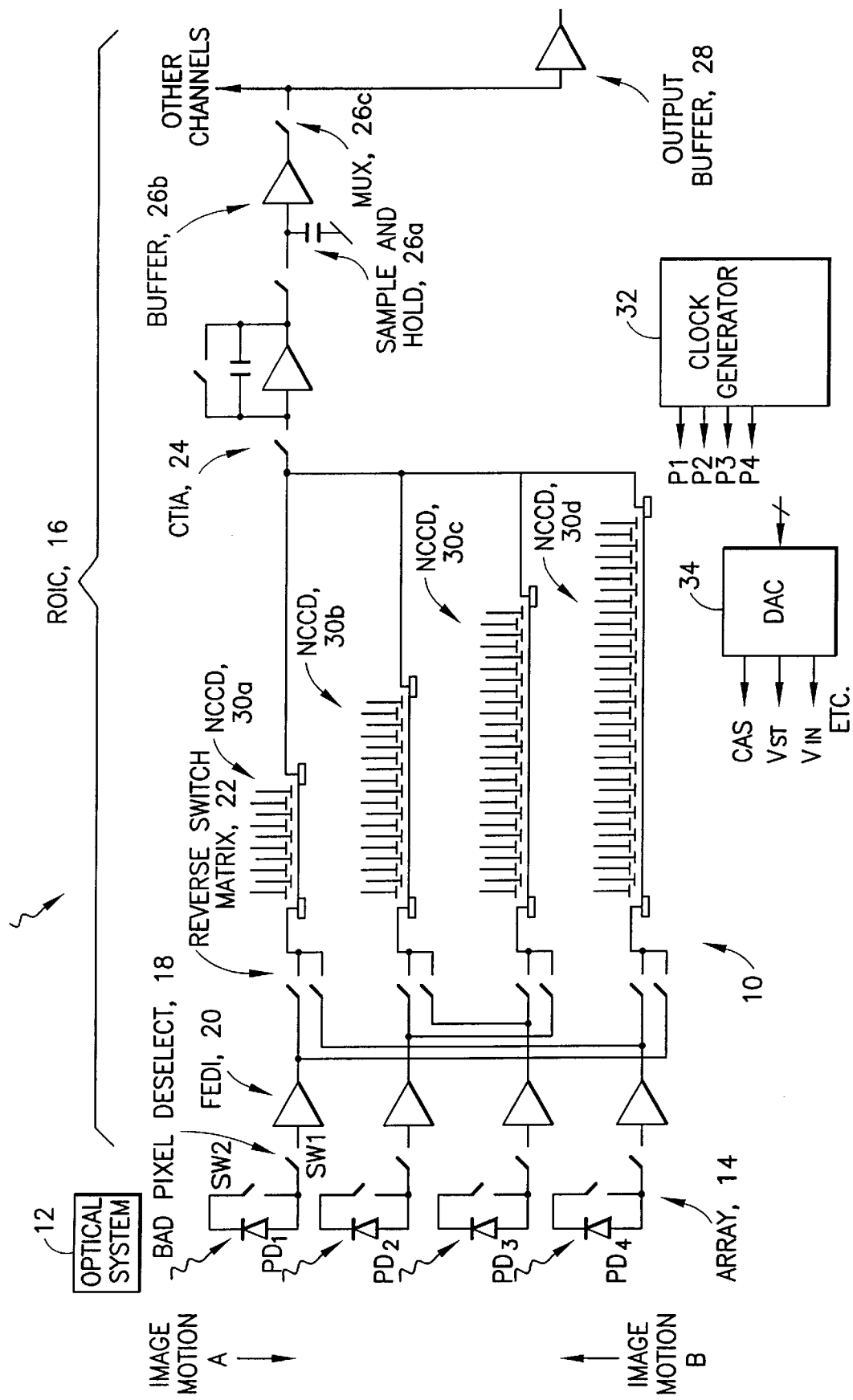
FIG. 5 is a simplified block diagram of an exemplary embodiment of a TDI imaging system that is constructed to incorporate NCCD structures in accordance with this invention.

Before describing the NCCD structure of this invention in further detail, it may prove useful to first give a general description of a TDI system within which the NCCD structure can be used to advantage. Referring to FIG. 5, there is shown a block diagram of a TDI imaging system 10 that is constructed and operated in accordance with an embodiment of the NCCD structure of this invention, wherein four NCCD structures are organized as four separate NCCD registers 30. It should be realized that the NCCD structure of this invention is not limited for use in only this type of TDI imaging system, nor is the NCCD structure of this invention limited for use in only TDI imaging applications, or in imaging applications in general. In fact, the NCCD structure of this invention may be used in a wide variety of applications wherein it is desired to readout charge packets and/or move charge packets from a point in an integrated circuit to another point.

In FIG. 5, a scene is viewed by an optical system 12, such as a telescope or a scanning mirror, which forms an optical image upon a radiation sensitive surface of a two-dimensional sensor array 14. The sensor array 14 may be organized as "I" rows and "J" columns of radiation detector elements. While the sensor array 14 could be constructed with charge coupled device (CCD) technology, in the presently preferred embodiment of this invention the sensor array 14 is comprised of Group II–VI semiconductor material (HgCdTe), and the individual photodiodes (PDs) of the sensor array 14 are responsive to infrared (IR) radiation.

In one embodiment of the invention the sensor array 14 is organized as two banks of 144×4 PDs, and the sensor array 14 is coupled to (e.g., hybridized with) a readout integrated circuit (ROIC) 16. The ROIC 16 contains, for example, four NCCD structures, organized as four NCCD registers 30a–30d of differing lengths.

The PDs can be individually deselected, which is shown schematically by the bad pixel deselect switches (SWs) 18 at the input to the ROIC 16. If a particular PD is not selected by leaving the corresponding SW1 open, then it is preferred to also then close the corresponding SW2 so as to short the affected PD. This results in a reduction of crosstalk between the "bad" PD and any neighboring "good" PDs during the readout process.

An input amplifier configuration is preferably a known type of Feedback Enhanced Direct Injection (FEDI) amplifier 20, which provides a current mode output that is switched for integration time control. A switch matrix (reverse switch matrix 22) is used for TDI direction control by mapping the FEDI output current to the TDI storage wells of selected NCCD registers 30a–30d. Each NCCD register 30 controls the associated PD sample delay for TDI processing. The outputs of the NCCD registers 30 are connected in common for each channel and are sampled by a capacitive feedback transimpedance amplifier (CTIA) 24. The output of the channel CTIA 24 is applied to a sample and hold 26a, a buffer 26b, and are then multiplexed (MUX 26c) to a high bandwidth output amplifier 28. From this point the output signals may be digitized and subsequently input to a signal processor (not shown) for performing any desired image processing applications.

Referring again briefly to the reverse switch matrix 22, and by way of further explanation, assume that image motion relative to the PDs is as is shown by arrow A. In this case the reverse switch matrix 22 is configured so that the output of the $PD_1$ FEDI 20 is coupled to the NCCD 30d (the longest register providing the greatest delay), and so that the output of the $PD_4$ FEDI 20 is coupled to the NCCD 30a (the shortest register providing the least delay.) Conversely, and assuming that the image motion relative to the PDs is as is shown by arrow B, the reverse switch matrix 22 is configured so that the output of the $PD_4$ FEDI 20 is coupled to the NCCD 30d, and so that the output of the $PD_1$ FEDI 20 is coupled to the NCCD 30a.

In this embodiment the ROIC 16 also includes a clock generator 32 that outputs any required clock signals, including the four phase (P1–P4) clock signals for the NCCD registers 30a–30d, and a programmable digital to analog converter (DAC) 34 that outputs various bias potentials, including a cascode (CAS) bias and other biases (e.g., VST and VIN), as will be described in further detail below. In other embodiments any of the clocks or analog bias voltages used by the ROIC 16 could be externally generated and provided as inputs to the ROIC 16.

Figure 6:
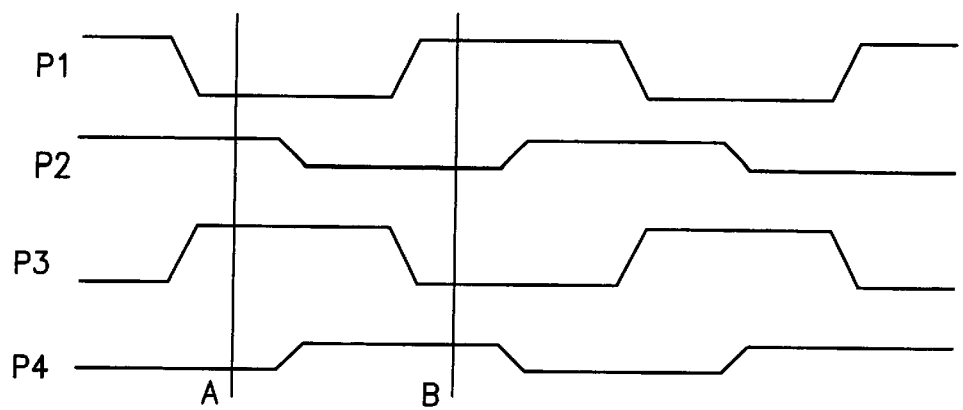
FIG. 6 and FIGS. 7A and 7B (collectively referred to as FIG. 7) illustrate the timing and schematic diagrams, respectively, for a four phase NCCD structure in accordance with this invention.
Figure 7A:
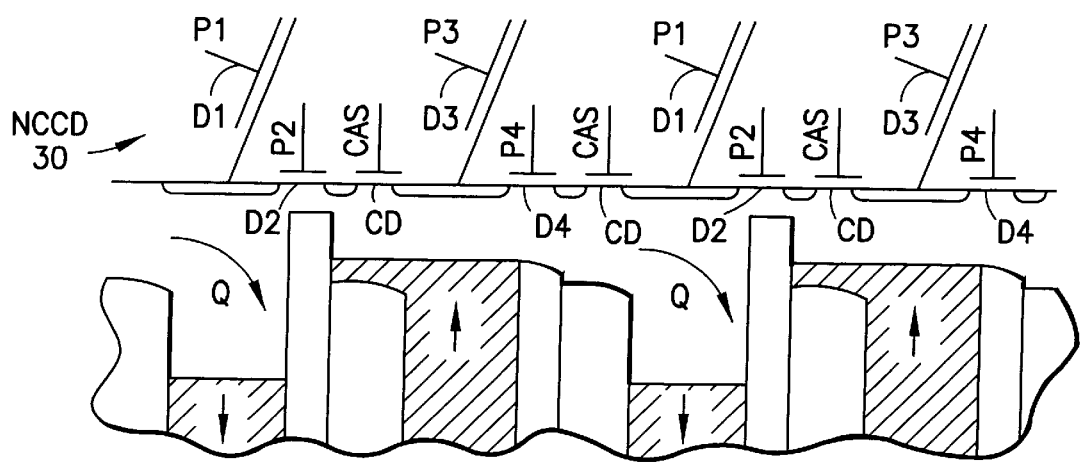
Figure 7B:
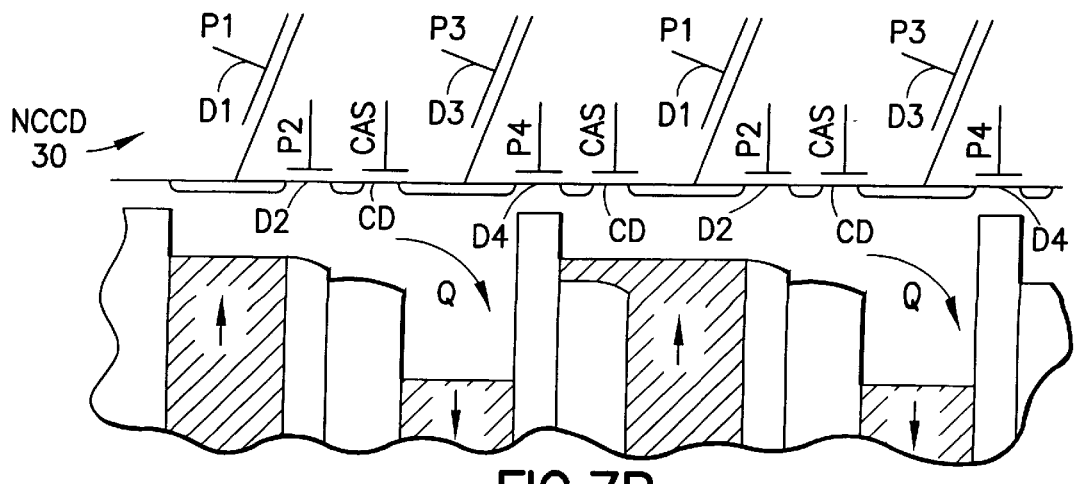

FIG. 6 and FIGS. 7A and 7B (collectively referred to as FIG. 7) illustrate the timing and schematic diagrams, respectively, for the four phase NCCD structure 30 in accordance with this invention. As in the case of the previous CCD and bucket brigade examples, a P-channel implementation is shown. It should be realized, however, that the teaching of this invention is not limited to being implemented only in P-channel embodiments.

Figure 3:
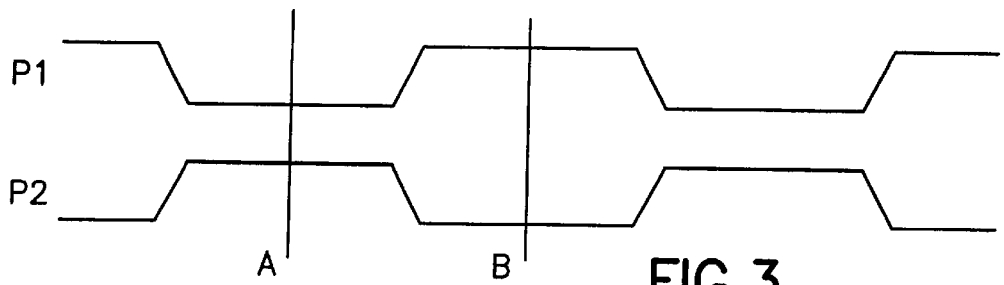
FIG. 3 and FIGS. 4A and 4B (collectively referred to as FIG. 4) illustrate the timing and schematic diagrams, respectively, for a conventional 2-phase bucket brigade structure, and are useful in explaining the operation of a prior art 2-phase single poly bucket brigade structure.
Figure 4A:
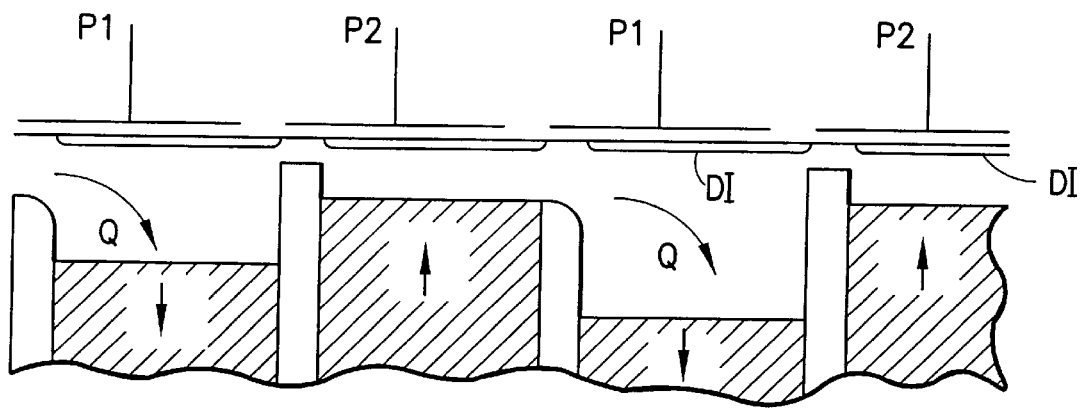
Figure 4B:
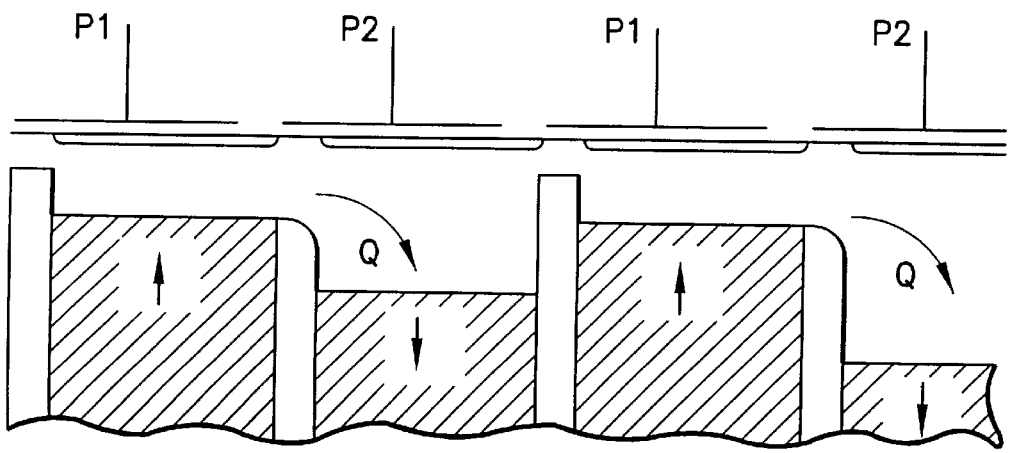
Figure 8:
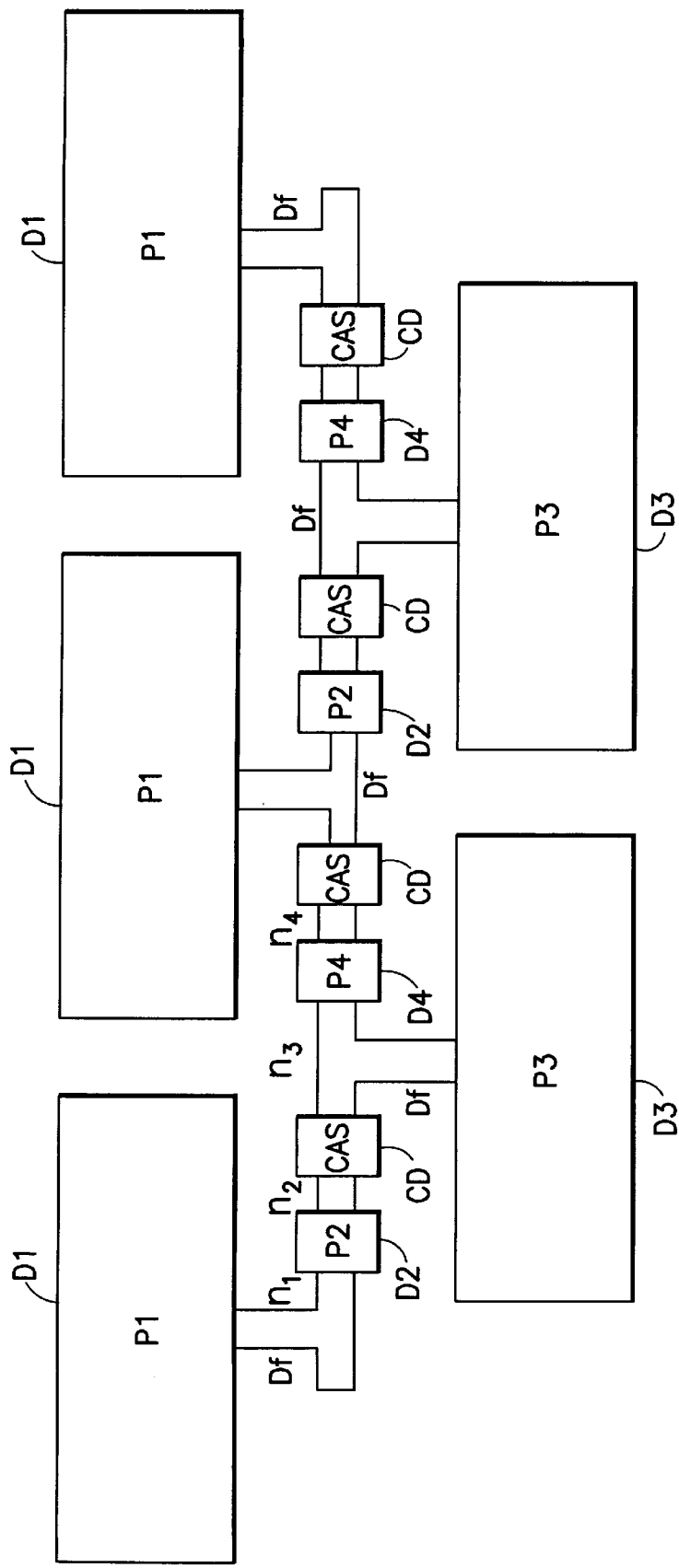
FIG. 8 is a simplified circuit layout diagram of the four phase NCCD structure in accordance with the teaching of this invention.

In a manner similar to the CCD discussed above and shown in FIGS. 1 and 2, the NCCD structure 30 includes two primary charge storage wells formed under the primary P1 and P3 transfer gates. In the NCCD structure these charge wells are depletion wells that are formed by the P1 and P3 gates being biased such that the underlying MOS surface is depleted. However, and unlike the bucket brigade structure shown in FIGS. 3 and 4, no depletion implant is used to form a charge storage region and drain for the charge wells. As a consequence, the charge wells may utilize the same diffusion for the source and drain of the NCCD structure 30. This feature is an important aspect in the design of the NCCD structure, as it avoids a charge loss mechanism that would occur if an independent source node were used. In the NCCD structure 30 the charge is transferred from the primary charge wells P1 to P3 by using the two phase gates P2 and P4 to aid in the transfer process, and to control the transfer direction. The gates P2 and P4 may be considered secondary transfer gates, with the gates P1 and P3 being the primary transfer gates. Referring also to FIG. 8, assume that a given P1-P2-CAS-P3-P4-CAS structure has nodes n1, n2, n3 and n4 as shown. The first cascode (CAS) device is located at the n2 side of P2 while the second CAS device located at the n4 side of P4, and is tied to a bias potential that is programmable within a range of, for example, 3.86 to 2.97 volts. Also by example, the P1 and P3 clocks transition between 0 and 6 volts, while the P2 and P4 clocks transition between 4 and 6 volts. In operation, the CAS devices create a finite potential that reduces an amount of charge that can be trapped under P1 and P3, and establishes the top of the P2 and P4 well.

More particularly, the following explanation describes the function of the CAS device with respect to the near complete charge transfer and reduction of transfer charge residue. This description addresses the charge transfer from the P1 primary charge storage well to the P3 primary charge storage well, and the function of P2 and the CAS device connecting P1 to P3. It should be noted here that the function of the P4 and CAS between the subsequent P3 and P1 charge wells functions in an identical manner.

The P2 transfer device and the CAS between wells P1 and P3 aid the near complete charge transfer process. This is accomplished by the CAS device maintaining a near constant potential at the drain of the transfer device P2 during charge transfer. This is important due to the fact that the barrier height under P2 during transfer establishes the final potential of the transferred charge well under P1, and any variations in the drain potential of P2 would effect the barrier height under the transfer device P2 and the final potential under the transfer gate P1. This change in potential under P1 would result in charge residue under P1 that is a function of the drain potential for the transfer devices P2. This effect would appear as poor charge transfer efficiency (CTE). The use of the cascode (CAS) device between P2 and P3 establishes a near constant drain potential at the drain of P2 (node n2) during transfer. This allows for a near constant drain induced barrier lowering effect for P2, and substantially eliminates the transferred charge residue under P1. The result is near complete charge transfer.

Figure 1:
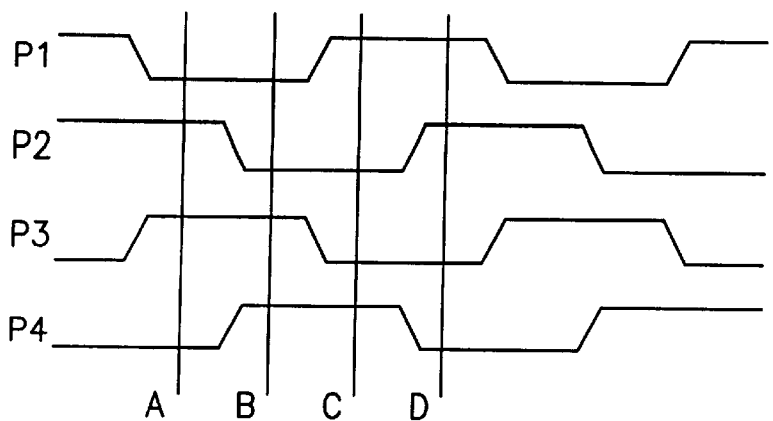
FIG. 1 and FIGS. 2A–2D (collectively referred to as FIG. 2) show timing and schematic diagrams, respectively, for a conventional four phase CCD structure, and are useful in explaining the operation of a prior art four phase double poly CCD structure.
Figure 2A:
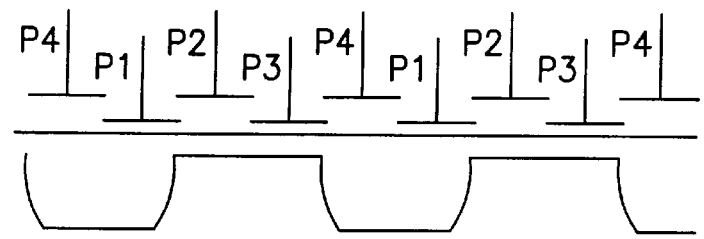
Figure 2B:
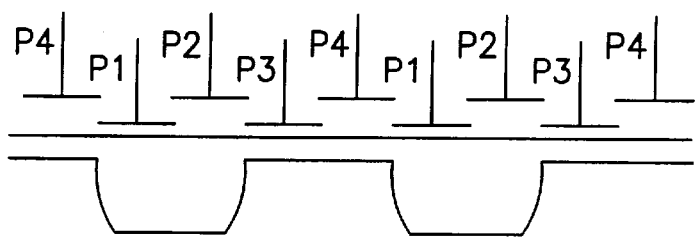
Figure 2C:
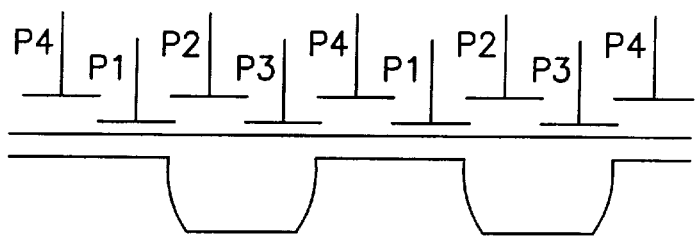
Figure 2D:
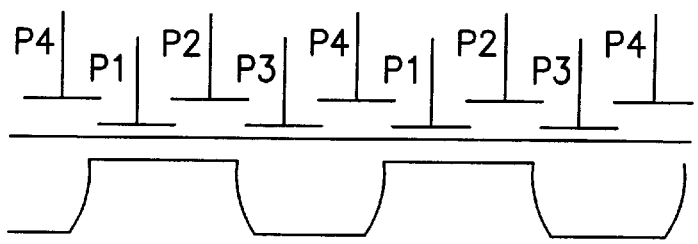
Figure 9:
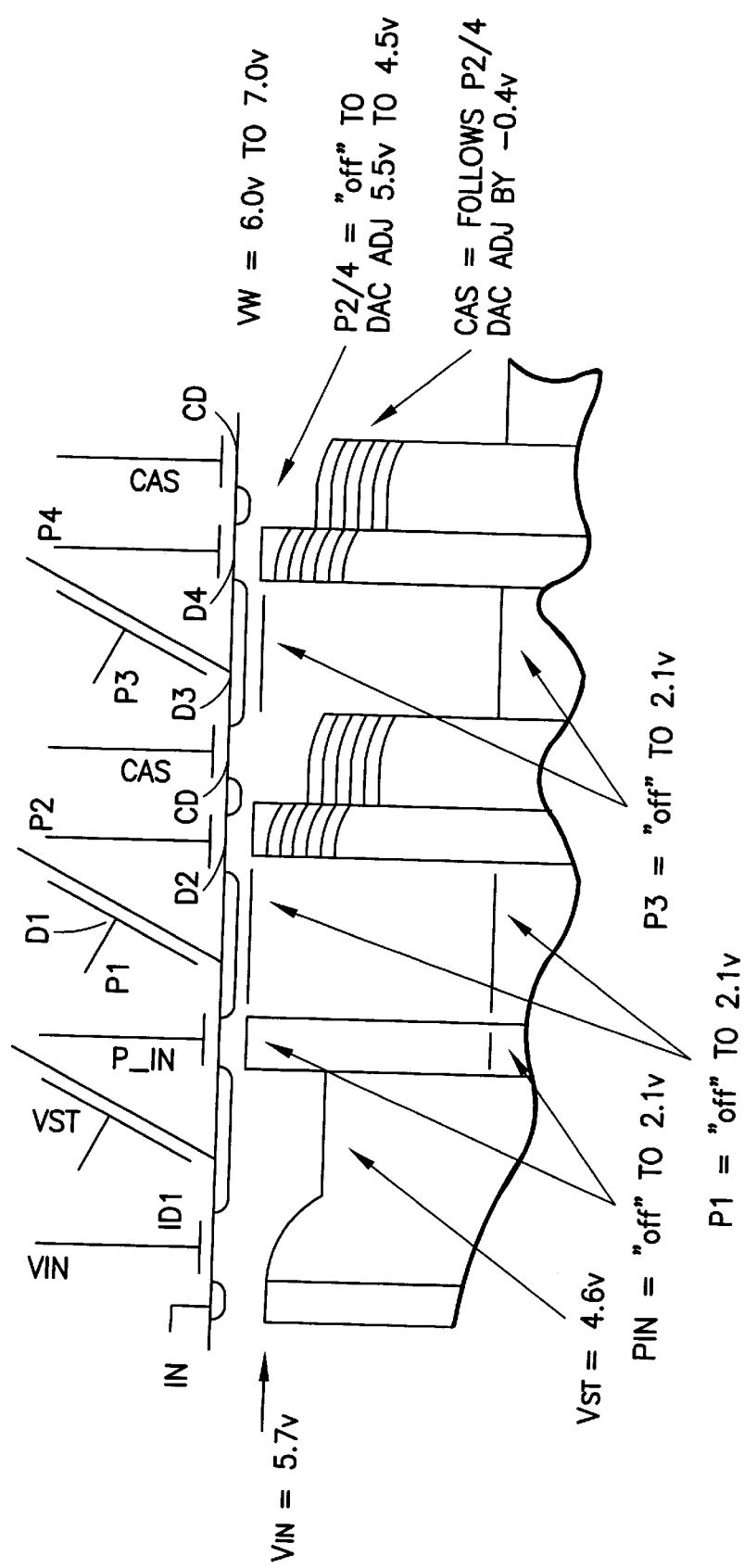
FIG. 9 is a schematic diagram depicting the four phase NCCD structure of FIGS. 7A and 7B in greater detail, and is useful in showing various fixed and programmable biasing arrangements, as well as a current input stage.
Figure 10:
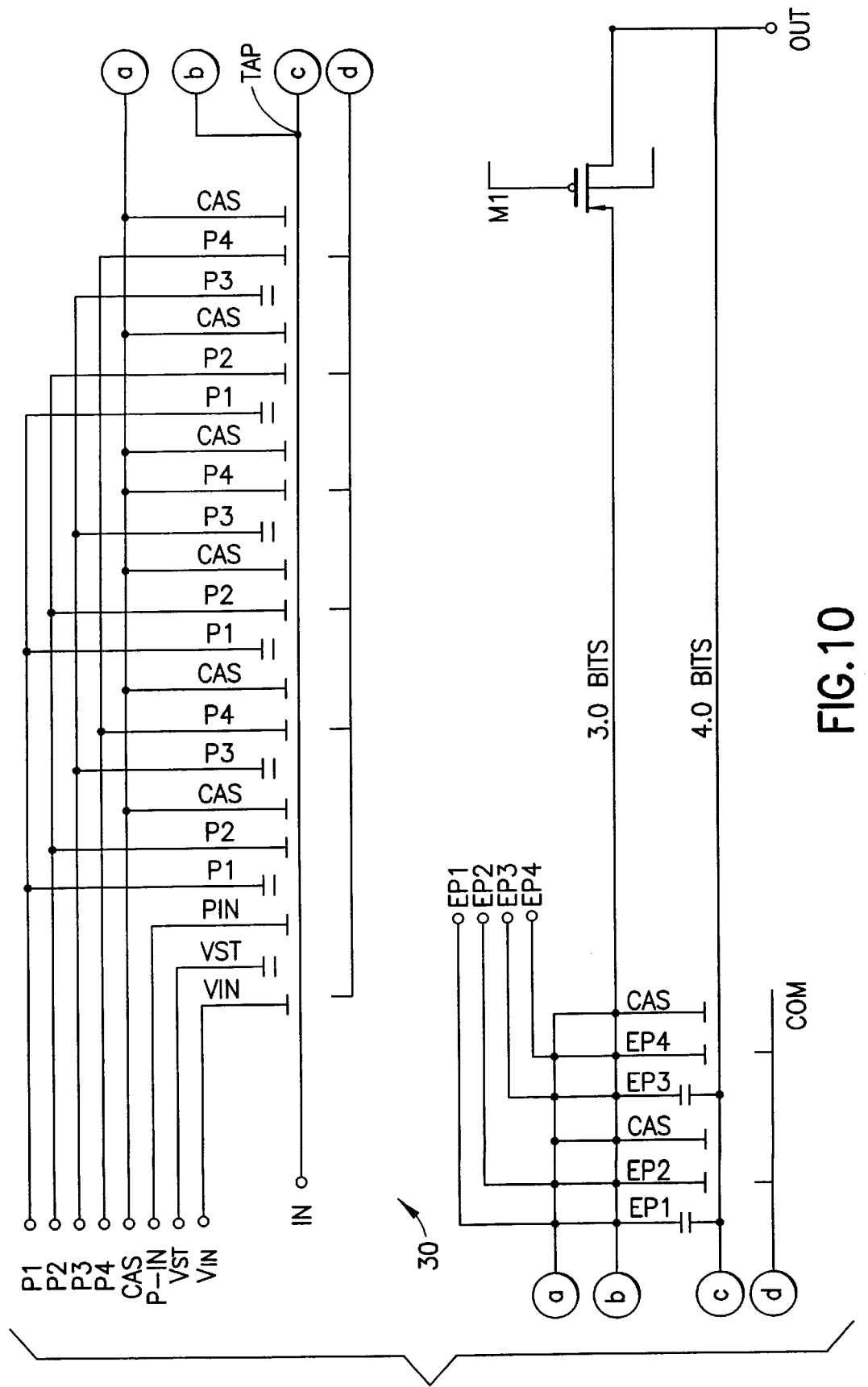
FIG. 10 is a schematic diagram of an exemplary multi-stage NCCD register, and illustrates an electronically programmable bit length feature.

As in the case for the CCD previously described in FIGS. 1 and 2, charge is introduced into, by example, the P1 well through the use of a charge injection structure (not shown). A number of different structures can be employed to provide this function, and a presently preferred embodiment is shown in FIGS. 9 and 10. The charge is introduced into the P1 well at a time when the P2 and P3 gates are off. FIG. 7A illustrates the schematic and surface potential diagrams for the timing condition "A" shown in FIG. 6. At timing condition "A" the P1 well is depleted, the P4 transfer device is enabled, and the P2 and P3 gates are off. At this time the charge under the P3 gate is completing transfer over the P4 and cascode (CAS) barriers into the P1 well. To prepare for transfer from the P1 to P3 wells, the P2 transfer gate is enabled, and the P4 transfer gate is disabled. The P1 gate is then clocked off and P3 gate is clocked on. This condition is illustrated in FIG. 6 as time condition "B". FIG. 7B illustrates the potential diagram for timing condition "B".

At this time it can be seen that charge in the P1 storage well pours over the potential barrier established by P2 and CAS, and into the storage well P3.

There are several important aspects to the design of the NCCD structure and its biasing. First, it will be noted in the potential diagrams shown in FIGS. 7A and 7B that the P2 and P4 gates are biased in their on state such that the surface potential under these gates is more positive (assuming a P-channel embodiment) than the surface potential under the adjacent CAS gate. This is done to prevent charge trapping under the P2 and P4 transfer gates. Second, it should be noted that the diffusions that connect the P1 and P3 wells to the P2 and P3 transfer and the cascode devices are preferably manufactured at a minimum size in order to reduce the generation of kTC noise in the NCCD structure 30.

Consistent with this, and referring also to FIG. 8, a single diffusion (Df) is used to provide both the functionality of the source in drain for each of the primary charge storage wells P1 and P3. In essence, the P1 and P3 charge wells may be thought of as single port devices, wherein charge flows into the storage well and out of the storage well through a single port, i.e., the relatively small diffusion (Df) that connects P1 or P3 to the serially connected two port P2, P4, CAS structures. It should also be noted here that the P1 and P3 charge wells act as pistons where charge is pulled in and pushed out the same port. As in the case of a CCD when the charge transfer from the primary charge well is complete, the overall effect is one of minimizing the capacitance on the node and its corresponding kTC noise term. The incomplete charge transfer comes from the relatively small geometry diffusion (Df) that connects the P1 stage to the P2/CAS transfer. The single diffusion (Df) also eliminates an additional charge trap that would be formed if a conventional two diffusion source input and drain output structure were used. Third, the low capacitance achieved in the drain of the P1, P3 storage well minimizes kTC noise and the incomplete charge transfer effects for the device.

As employed herein, the "incomplete" or "near complete" charge transfer of the NCCD structure 30 is contrasted with the conventional CCD, which may be thought of as providing essentially complete charge transfer. In any case, the charge transfer efficiency of the NCCD 30 may still be over 99.9%.

In FIG. 8 the charge wells P1 and P3 are shown to be organized in a meander-like manner, with the P2, P4 transfer and cascode gates interconnected between them via their sources and drains.

As an example of the utility of this invention, the NCCD structure 30 as described may be incorporated into a 240×4

(or extended 288×4) scanning multiplexer array ROIC 16 containing the internal clock generation and bias circuits (i.e., the clock generator 32 and DAC 34 of FIG. 5). The programmable DAC 34 is incorporated into the multiplexer array to program the cascode (CAS) gate potential and corresponding barrier height. The DAC 34 also develops the potential for biasing the P2 and P4 transfer gates. The DAC circuit 34 establishes a fixed potential difference between the surface potential under the cascode (CAS) and the P2 and P4 transfer gates (for example, the CAS potential follows the P2/P4 potential by −0.4 v). That is, the P2 and P4 barriers are DAC-adjustable, and the CAS function automatically tracks the P2 and P4 barriers as is illustrated in FIG. 9. The DAC 34 does, however, allow the variable biasing of these potentials as a group.

In greater detail, and referring to FIG. 9, the primary transfer gates P1 and P3 are clocked 0 to 6 volts, and the off state can be shifted to depletion by the bias VW. The on state is the body effect for a surface potential of about 2.1 volts. The secondary gates P2 and P4 are clocked from a DAC-adjusted level to 6 volts, where the off state can be shifted to depletion by the bias VW, and where the on state surface potential is adjustable from 4.5 volts to 5.5 volts. FIG. 9 also shows the input node (IN), as well as other input-related bias levels VIN, VST and P_IN, and the above-mentioned CAS potential following the P2/P4 potentials by −0.4 v.

Also shown in FIG. 9 is an injector circuit which can be used to inject charge into the first stage (P1) of the NCCD 30. Here the biases VIN, VST, and clock PIN are used to support the injection process. The bias VIN to the gate of the first input device (ID1) is biased for a source potential of 5.7 volts to provide threshold level operation. The drain of the input device is connected to a single port depletion well VST which provides a temporary charge storage well for charge to reside in prior to the injection into the transfer device (P1). A clocked barrier under device P_IN periodically allows the charge under the temporary charge storage well VST to flow into transfer gate P1. The charge well under P1 is then isolated by P_IN and is then transferred as described previously.

An additional feature enabled by the NCCD structure 30 of this invention is an ability to electronically change the number of NCCD structure transfer stages. It is noted that it is common in the terminology of four-phase CCD structures to refer to a charge transfer stage (P1-P2-P3-P4-) as a bit. For the example shown in FIG. 7 two (P1-P2-P3-P4-) transfer stages, or two bits, are shown.

FIG. 10 shows a schematic diagram for an exemplary one of the NCCD registers 30a–30d used in the scanning array that forms a part of the TDI readout integrated circuit 16 shown in FIG. 5. The TDI signal processing function for the array provides for a bi-directional scan and two or three samples per dwell sampling delay. The variable bit length (in this example 3 bits or 4 bits) NCCD register 30 feature is implemented by using a MOS device (M1) to tap into the NCCD register 30 at the point labeled TAP. When 4-bit operation is selected additional or extended clock phases (EP1–EP4) are used, in conjunction with the programmable CAS bias potential, as was described for FIG. 9. Note also the signal injection stage and biases are shown as well in FIG. 10, in the same manner as they are depicted in FIG. 9. FIG. 10 also makes it clear that the basic NCCD structure shown in FIGS. 7A and 7B can be replicated a plurality of times for forming a register of arbitrary length.

The near complete charge transfer device (NCCD) structure 30 that has been described above enables time delay and integrate (TDI) and other desirable signal processing functions to be implemented using a standard complementary metal oxide semiconductor (CMOS) processing technology. For example, TDI signal processing is desired for providing enhanced signal-to-noise and uniformity performance in scanning IR sensor arrays. This NCCD structure 30 of this invention enables the TDI function to be realized, with noise and charge transfer efficiency approaching the performance of traditional charge transfer devices, in low-cost, highly producible CMOS manufacturing technologies (Commercial CMOS). In fact, the NCCD structure 30 is manufacturable in standard sub-micron commercial CMOS technologies.

Furthermore, the NCCD structure 30 can provide a constant size well for each register, and each IR detector output signal can be maintained independently throughout the TDI transfer to minimize the effect of injection and TDI transfer errors. Furthermore, the layout enables input and output at both ends of the NCCD register. In addition, the NCCD register can be programmed for one, two, three (or more) samples per dwell. Furthermore, the NCCD register biases can be adjusted. In particular, and as was described above and shown in FIG. 9, the P2 and P4 barriers are DAC-adjustable, and the register CAS function automatically tracks the P2 and P4 barriers. The n-well direct interface also allows depleted surface operation.

The teachings of this invention have been described in the context of various exemplary embodiments of voltage potentials, numbers of bits, numbers of stages, etc. It should be realized, however, that these specific values are not to be construed in a limiting sense upon the practice of this invention. Thus, while the invention has been particularly shown and described with respect to preferred embodiments thereof, it will be understood by those skilled in the art that changes in form and details may be made therein without departing from the scope and spirit of the invention.

What is claimed is:

1. A charge transfer structure, comprising:

a substrate comprised of semiconductor material and, coupled to a surface of said substrate;

a plurality of serially coupled devices each having a gate terminal and comprising a first single port device (D1) defining a first primary charge storage well, a second single port device (D3) defining a second primary charge storage well, a first two port device (D2) defining a first transfer device, a second two port device (D4) defining a second transfer device, and two instances of a third two port device each defining a cascode device (CD), said ports of said devices being serially coupled together in an order given by D1, D2, CD, D3, D4, CD for transferring charge between said first and second primary charge storage wells; wherein charge is inserted into and withdrawn from each of said first and second primary charge storage wells through a single diffusion that functions as both an input port and an output port.

2. A charge transfer device as in claim 1, wherein a clock signal (P1) applied to said gate of D1 and a clock signal (P3) applied to said gate of D3 are each predetermined to deplete an underlying surface region of said substrate for forming said first primary charge storage well and said second primary charge storage well, respectively.

3. A charge transfer device as in claim 1, wherein for a P-channel implementation said gates of D2 and D4 are each biased, when in an on state, such that a surface potential under said gates is more positive than a surface potential under said adjacent one of said CD gates so as to minimize charge trapping under said D2 and D4 gates.

4. A charge transfer device as in claim 3, wherein said CD gates are biased so as to be more negative by a predetermined amount than the magnitude of a bias potential applied to said gates of D2 and D4, and wherein the magnitude of the bias potential applied to said CD gates follows the magnitude of the bias potential applied to said gates of D2 and D4.

5. A charge transfer device as in claim 1, wherein for an N-channel implementation said gates of D2 and D4 are each biased, when in an on state, such that a surface potential under said gates is more negative than a surface potential under said adjacent one of said CD gates so as to minimize charge trapping under said D2 and D4 gates.

6. A charge transfer device as in claim 5, wherein said CD gates are biased so as to be more positive by a predetermined amount than the magnitude of a bias potential applied to said gates of D2 and D4, and wherein the magnitude of the bias potential applied to said CD gates follows the magnitude of the bias potential applied to said gates of D2 and D4.

7. A charge transfer structure, comprising:
a substrate comprised of semiconductor material and, coupled to a surface of said substrate;
a first primary transfer gate (PTG1) overlying a first primary charge storage well, a second primary transfer gate (PTG2) overlying a second primary charge storage well, a first secondary transfer gate (STG1), a second secondary transfer gate (STG2), a first cascode gate (CG1) and a second cascode gate (CG2), said gates being serially coupled together in an order given by PTG1, STG1, CG1, PTG2, STG2, CG2 for transferring charge between said first and second primary charge storage wells under the influence of signals applied to said PTG1, STG1, CG1, PTG2, STG2 and CG2; wherein
a clock signal (P1) applied to said first primary transfer gate PTG1 and a clock signal (P3) applied to said second primary transfer gate PTG2 are each predetermined to deplete an underlying surface region of said substrate for forming said first primary charge storage well and said second primary charge storage well, respectively, and wherein charge is inserted into and withdrawn from each of said first and second primary charge storage wells through a single diffusion that functions as both a source node and a drain node.

8. A charge transfer device as in claim 7, wherein for a P-channel implementation said SGT1 and SGT2 each biased, when in an on state, such that a surface potential under said gates is more positive than a surface potential under said adjacent one of said CG1 or CG2 so as to minimize charge trapping under said SGT1 and SGT2.

9. A charge transfer device as in claim 8, wherein said CG1 and CG2 are biased so as to be more negative by a predetermined amount than the magnitude of a bias potential applied to said SGT1 and SGT2, and wherein the magnitude of the bias potential applied to said CG1 and CG2 follows the magnitude of the bias potential applied to said CG1 and CG2.

10. A charge transfer device as in claim 7, wherein for an N-channel implementation said SGT1 and SGT2 each biased, when in an on state, such that a surface potential under said gates is more negative than a surface potential under said adjacent one of said CG1 or CG2 so as to minimize charge trapping under said SGT1 and SGT2.

11. A charge transfer device as in claim 10, wherein said CG1 and CG2 are biased so as to be more positive by a predetermined amount than the magnitude of a bias potential applied to said SGT1 and SGT2, and wherein the magnitude of the bias potential applied to said CG1 and CG2 follows the magnitude of the bias potential applied to said CG1 and CG2.

12. A charge transfer device as in claim 7, wherein said order given by PTG1, STG1, CG1, PTG2, STG2, CG2 represents a basic unit of said charge transfer device, and wherein a plurality of said basic units are serially coupled together for forming a charge transfer register comprised of a plurality of said basic units.

13. A charge transfer device as in claim 12, and further comprising an electronically actuated tap for changing a number of said basic units of said charge transfer register.

14. A charge transfer device as in claim 12, wherein said charge transfer register forms a part of a readout integrated circuit having input nodes for coupling to outputs of radiation detectors, and circuitry for converting output signals from said radiation detectors into charge signals for injection into said charge transfer register.

15. A charge transfer device as in claim 12, wherein said signals are actuated for transferring the charge for implementing a time delay and integration (TDI) function.

16. A charge transfer device as in claim 7, and further comprising an input charge injection stage comprising a storage well for temporarily storing input charge prior to said input charge being transferred to a first PTG1.

17. A method for transferring charge, comprising steps of:
providing a substrate comprised of semiconductor material and, coupled to a surface of said substrate, a plurality of serially coupled devices each having a gate terminal and comprising a first single port device (D1) defining a first primary charge storage well, a second single port device (D3) defining a second primary charge storage well, a first two port device (D2) defining a first transfer device, a second two port device (D4) defining a second transfer device, and two instances of a third two port device each defining a cascode device (CD), said ports of said devices being serially coupled together in an order given by D1, D2, CD, D3, D4, CD for transferring charge between said first and second primary charge storage wells;
wherein charge is transferred by generating clock and bias signals and applying said signals to said gates of D1, D2, D3, D4 and CD such that clock signal P1 is applied to said gate of D1, clock signal P2 is applied to said gate of D2, clock signal P3 is applied to said gate of D3, and clock signal P4 is applied to said gate of D4, and a bias signal CAS is applied to said gate of each CD, said clock signals transitioning between first and second states for enabling and disabling said associated devices;
at a time when D1 and D4 are enabled, and D2 and D3 are disabled, transferring charge from a previous second primary storage well into the first primary storage well over the D4 and CAS barriers;
preparing to transfer charge from the first primary storage well into the second primary storage well by enabling P2 and disabling P4; and
turning off D1 and turning on D3 for transferring charge from the first primary storage well into the second primary storage well over the D2 and CAS barriers.

18. A method as in claim 17, wherein for a P-channel embodiment said gates of D2 and D4 are each biased, when enabled, such that a surface potential under said gates is more positive than a surface potential under said adjacent one of said CD gates so as to minimize charge trapping under said D2 and D4 gates.

19. A method as in claim 17, wherein said CD gates are biased so as to be more negative by a predetermined amount than the magnitude of a bias potential applied to said gates of D2 and D4, and wherein the magnitude of the bias potential applied to said CD gates follows the magnitude of the bias potential applied to said gates of D2 and D4.

20. A method as in claim 17, wherein for an N-channel embodiment said gates of D2 and D4 are each biased, when enabled, such that a surface potential under said gates is more negative than a surface potential under said adjacent one of said CD gates so as to minimize charge trapping under said D2 and D4 gates.

21. A method as in claim 20, wherein said CD gates are biased so as to be more positive by a predetermined amount than the magnitude of a bias potential applied to said gates of D2 and D4, and wherein the magnitude of the bias potential applied to said CD gates follows the magnitude of the bias potential applied to said gates of D2 and D4.

* * * * *